(12) United States Patent
Harel

(10) Patent No.: US 10,872,846 B2
(45) Date of Patent: Dec. 22, 2020

(54) SOLID TOP TERMINAL FOR DISCRETE POWER DEVICES

(71) Applicant: RENESAS ELECTRONICS AMERICA INC., Milpitas, CA (US)

(72) Inventor: Jean Claude Harel, San Jose, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 16/015,106

(22) Filed: Jun. 21, 2018

(65) Prior Publication Data

US 2019/0006267 A1 Jan. 3, 2019

Related U.S. Application Data

(60) Provisional application No. 62/523,547, filed on Jun. 22, 2017.

(51) Int. Cl.
*H01L 23/495* (2006.01)
*H01L 23/00* (2006.01)
(Continued)

(52) U.S. Cl.
CPC .... *H01L 23/49524* (2013.01); *H01L 21/4825* (2013.01); *H01L 21/78* (2013.01);
(Continued)

(58) Field of Classification Search
CPC ... H01L 23/49524; H01L 24/84; H01L 24/83; H01L 24/73; H01L 24/40; H01L 24/37; H01L 23/49575; H01L 23/49562; H01L 21/78; H01L 23/49503; H01L 29/66333; H01L 29/7395; H01L 21/4825; H01L 2924/13055; H01L 2924/1203; H01L 2924/00015; H01L 2224/94; H01L 2224/92246; H01L 2224/9221; H01L 2224/8384; H01L 2224/83439; H01L 2224/83203; H01L 2224/73263; H01L 2224/33181; H01L 2224/32245; H01L 2224/29339; H01L 2224/291; H01L 24/94; H01L 24/92; H01L 24/33; H01L 24/32; H01L 24/29; H01L 24/27; H01L 23/49537; H01L 2224/8484; H01L 2224/37013;
(Continued)

(56) References Cited

U.S. PATENT DOCUMENTS 6,879,024 B2 4/2005 Kawano
7,230,324 B2 6/2007 Kawano
(Continued)

FOREIGN PATENT DOCUMENTS

JP 2009-111248 A 5/2009

OTHER PUBLICATIONS

Foreign Action other than Search Report on PCT PCT/US2018/038842 dated Jan. 2, 2020.

*Primary Examiner* — David Vu
(74) *Attorney, Agent, or Firm* — Foley & Lardner LLP

(57) ABSTRACT

A solid top terminal for discrete power devices. In one embodiment, an apparatus is formed that includes a first die comprising a transistor, which in turn includes a first electrode such as an emitter. The apparatus also includes a first conductor sintered to an electroplated second conductor such as a solid top terminal. Importantly, the first conductor is electrically coupled to the first electrode.

20 Claims, 4 Drawing Sheets

(51) Int. Cl.
*H01L 21/48* (2006.01)
*H01L 21/78* (2006.01)
*H01L 29/66* (2006.01)
*H01L 29/739* (2006.01)
*H02M 7/00* (2006.01)

(52) U.S. Cl.
CPC .. *H01L 23/49503* (2013.01); *H01L 23/49562* (2013.01); *H01L 23/49575* (2013.01); *H01L 24/37* (2013.01); *H01L 24/40* (2013.01); *H01L 24/73* (2013.01); *H01L 24/83* (2013.01); *H01L 24/84* (2013.01); *H01L 29/66333* (2013.01); *H01L 29/7395* (2013.01); H01L 23/49537 (2013.01); H01L 24/27 (2013.01); H01L 24/29 (2013.01); H01L 24/32 (2013.01); H01L 24/33 (2013.01); H01L 24/48 (2013.01); H01L 24/92 (2013.01); H01L 24/94 (2013.01); H01L 2224/27318 (2013.01); H01L 2224/291 (2013.01); H01L 2224/29339 (2013.01); H01L 2224/32245 (2013.01); H01L 2224/33181 (2013.01); H01L 2224/37013 (2013.01); H01L 2224/40095 (2013.01); H01L 2224/40137 (2013.01); H01L 2224/40499 (2013.01); H01L 2224/48245 (2013.01); H01L 2224/73263 (2013.01); H01L 2224/8384 (2013.01); H01L 2224/83203 (2013.01); H01L 2224/83439 (2013.01); H01L 2224/8484 (2013.01); H01L 2224/84203 (2013.01); H01L 2224/84345 (2013.01); H01L 2224/84439 (2013.01); H01L 2224/9221 (2013.01); H01L 2224/92246 (2013.01); H01L 2224/94 (2013.01); H01L 2924/00015 (2013.01); H01L 2924/1203 (2013.01); H01L 2924/13055 (2013.01); H01L 2924/13091 (2013.01); H01L 2924/181 (2013.01); H02M 7/003 (2013.01)

(58) Field of Classification Search
CPC . H01L 2224/40499; H01L 2224/84439; H01L 2224/40095; H01L 2224/84203; H01L 2924/181; H01L 2224/40137; H01L 2224/48245; H01L 24/48; H01L 2224/84345; H01L 2224/27318
See application file for complete search history.

(56) References Cited

U.S. PATENT DOCUMENTS

| | | | |
|---|---|---|---|
| 7,385,278 | B2 | 6/2008 | Kawano |
| 7,541,858 | B2 | 6/2009 | Yukutake et al. |
| 7,602,045 | B2 | 10/2009 | Nagase et al. |
| 7,776,660 | B2 | 8/2010 | Miyashita et al. |
| 8,138,600 | B2 | 3/2012 | Muto et al. |
| 8,222,651 | B2 | 7/2012 | Kanazawa et al. |
| 8,299,495 | B2 | 10/2012 | Inagawa |
| 8,581,299 | B2 | 11/2013 | Tsujiuchi et al. |
| 8,586,480 | B1 | 11/2013 | Zommer |
| 8,587,087 | B2 | 11/2013 | Arai et al. |
| 8,629,467 | B2 | 1/2014 | Kanazawa et al. |
| 8,633,510 | B2 | 1/2014 | Matsuura et al. |
| 8,638,533 | B2 | 1/2014 | Uenishi |
| 9,041,050 | B2 | 5/2015 | Matsuura |
| 9,064,839 | B2 | 8/2015 | Matsuura et al. |
| 9,153,673 | B2 | 10/2015 | Tsujiuchi et al. |
| 9,349,827 | B2 | 5/2016 | Matsuura et al. |
| 9,368,595 | B2 | 6/2016 | Matsuura |
| 9,406,787 | B2 | 8/2016 | Ikegami et al. |
| 9,583,604 | B2 | 2/2017 | Tsujiuchi et al. |
| 9,583,606 | B2 | 2/2017 | Tsuyuki |
| 9,614,066 | B2 | 4/2017 | Matsuura |
| 9,653,587 | B2 | 5/2017 | Matsuura |
| 9,704,979 | B2 | 7/2017 | Muto et al. |
| 9,780,187 | B2 | 10/2017 | Ikegami et al. |
| 9,847,410 | B2 | 12/2017 | Matsuura |
| 9,906,165 | B2 | 2/2018 | Muto et al. |
| 9,941,396 | B2 | 4/2018 | Matsuura |
| 9,978,857 | B2 | 5/2018 | Tsuyuki |
| 9,997,620 | B2 | 6/2018 | Muto et al. |
| 9,997,622 | B2 | 6/2018 | Matsuura |
| 2010/0187678 | A1 | 7/2010 | Kajiwara et al. |
| 2011/0221008 | A1 | 9/2011 | Lu et al. |
| 2013/0328204 | A1* | 12/2013 | Zommer ............... B23K 1/20 257/765 |
| 2014/0001481 | A1* | 1/2014 | Michikoshi ....... H01L 23/49531 257/76 |
| 2015/0130076 | A1 | 5/2015 | Hino |
| 2015/0162287 | A1 | 6/2015 | Hosseini et al. |
| 2015/0249067 | A1* | 9/2015 | Lee ................. H01L 25/0657 257/777 |

* cited by examiner

SOLID TOP TERMINAL FOR DISCRETE POWER DEVICES

CROSS-REFERENCE TO RELATED APPLICATIONS

The present application claims priority to U.S. Provisional Patent Application No. 62/523,547, filed Jun. 22, 2017, the contents of which are incorporated by reference herein in their entirety.

BACKGROUND

Discrete power devices are used to switch large currents in many power applications. Common power devices include thyristors, bipolar transistors, power metal-oxide-semiconductor field-effect transistors (MOSFETs), etc., or combinations thereof. The insulated-gate bipolar transistor (IGBTs) is a power device that has replaced the bipolar transistor in many applications. Essentially an IGBT is a bipolar transistor driven by a power MOSFET; it has the advantages of being a minority carrier device (good performance in the on-state, even for high voltage devices), with the high input impedance of a MOSFET (it can be driven on or off with a very low amount of power).

SUMMARY

A solid top terminal for discrete power devices. In one embodiment, an apparatus is formed that includes a first die comprising a transistor, which in turn includes a first electrode such as an emitter. The apparatus also includes a first conductor sintered to an electroplated second conductor such as a solid top terminal. Importantly, the first conductor is electrically coupled to the first electrode.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

Figure 1A:
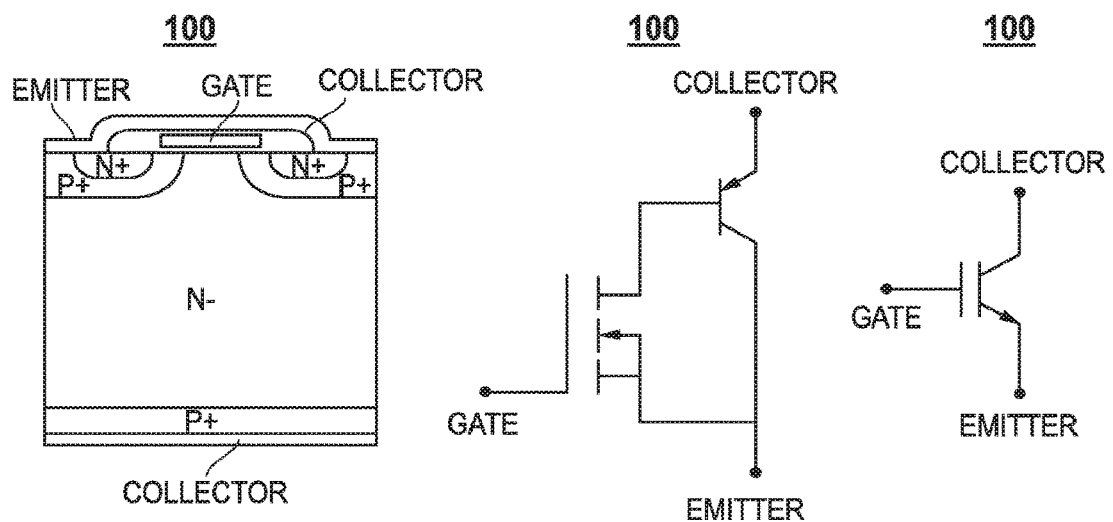
FIG. 1A illustrates an example IGBT.

FIG. 1A is a diagram illustrating a cross sectional, circuit equivalent, and symbol of an example IGBT 100. IGBTs, including IGBT 100, are often used as discrete devices in power applications. With reference to the cross sectional view of FIG. 1A, IGBT 100 is built as a vertical structure with two electrodes (e.g., gate and emitter) near the top of a semiconductor die and one electrode (e.g., collector) on the back of the die as shown. The IGBT is a recent component, so its performance improves regularly as technology evolves. Structural changes are often made to IGBTs in order to accommodate the higher current density, higher power dissipation, and/or higher reverse breakdown voltage that are needed for power applications.

Figure 1B:
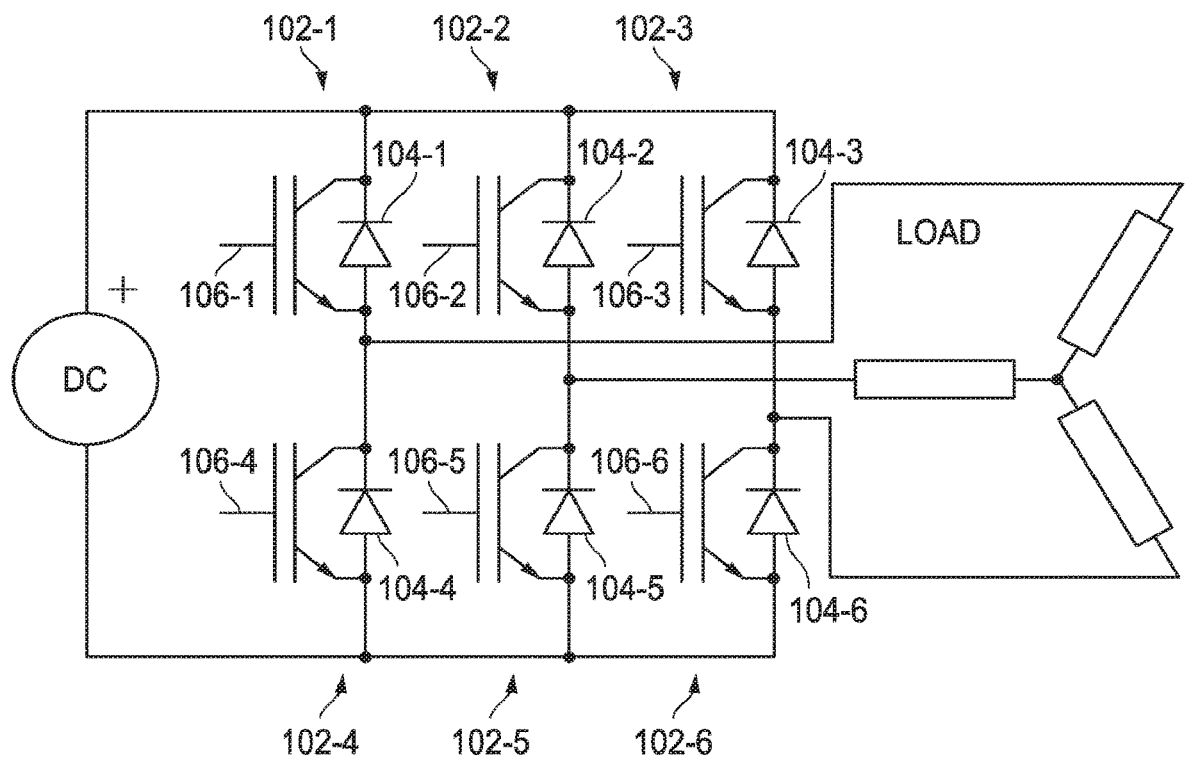
FIG. 1B illustrates an example inverter employing the IGBT of FIG. 1A.

Inverters employ IGBT based power devices. An inverter is a power application that converts direct current (DC) to alternating current (AC) for use by, for example, electric motors. Inverters typically use several power devices connected in parallel, making it attractive for power levels up to several megawatts. FIG. 1B illustrates relevant components of an example inverter that employs IGBT based power devices 102. With continuing reference to FIG. 1A, FIG. 1B shows power devices 102 coupled between a DC source (e.g., a battery) and a load (e.g., an electric motor). Each power device 102 includes an IGBT 100 coupled in parallel with a diode 104. IGBTs 100 include gates 106 that are coupled directly or indirectly (e.g., via drivers, not shown) to one or more controllers (e.g., microcontrollers, not shown). The controller generates pulse-width modulation (PWM) signals that control (e.g., activate or deactivate) respective IGBTs 100 via their gates 106 that control the flow of current between the collector and emitter.

Figure 2:
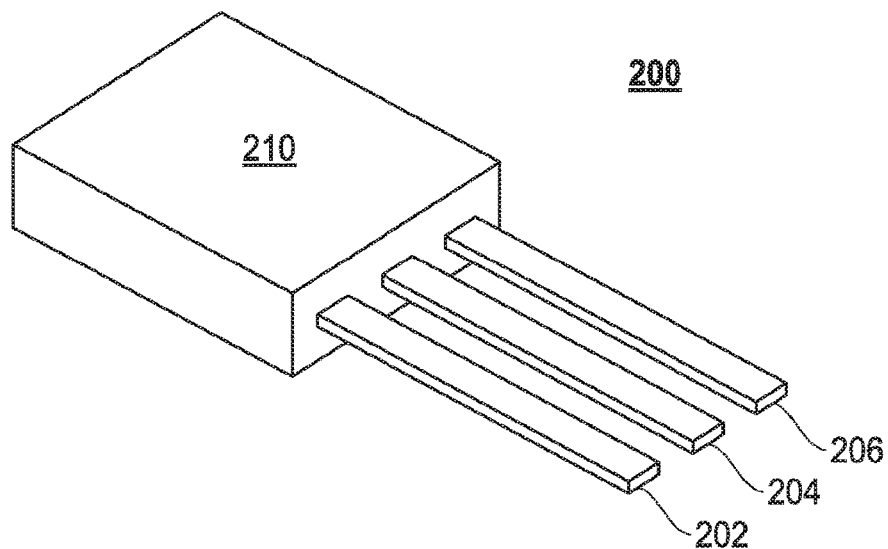
FIG. 2 illustrates an example power device package.

Power devices, like power device 102, are typically contained in packages. FIG. 2 illustrates an example package 200 containing power device 102. In general, packaged power devices are required to have specific operational characteristics and form factors. For high-power applications, packaged power devices are required to handle high electrical currents, dissipate large amounts of heat, manage thermal expansion-induced stresses for high reliability, etc. And these requirements must be accomplished at low cost. Cost, in this case, includes assembly as well as materials. Package 200 includes conductive leads 202-206 extending from an encapsulation or housing 210 that can be formed from a non-conductive material such as an epoxy resin. The housing protects power device 102 from moisture, dust, etc., and provides a way to remove heat generated by the device. Conductive leads 202-206, which are formed from a conductive material such as metal (e.g., copper), have specified spacing from each other, specified cross sectional shape (e.g., rectangular), specified size to fit in sockets (not shown) of, for example, the inverter shown in FIG. 2, etc. Unfortunately, packages, like the one shown in FIG. 2 limit the operation of power devices like IGBT 100 as will be more fully described below.

Figure 3A:
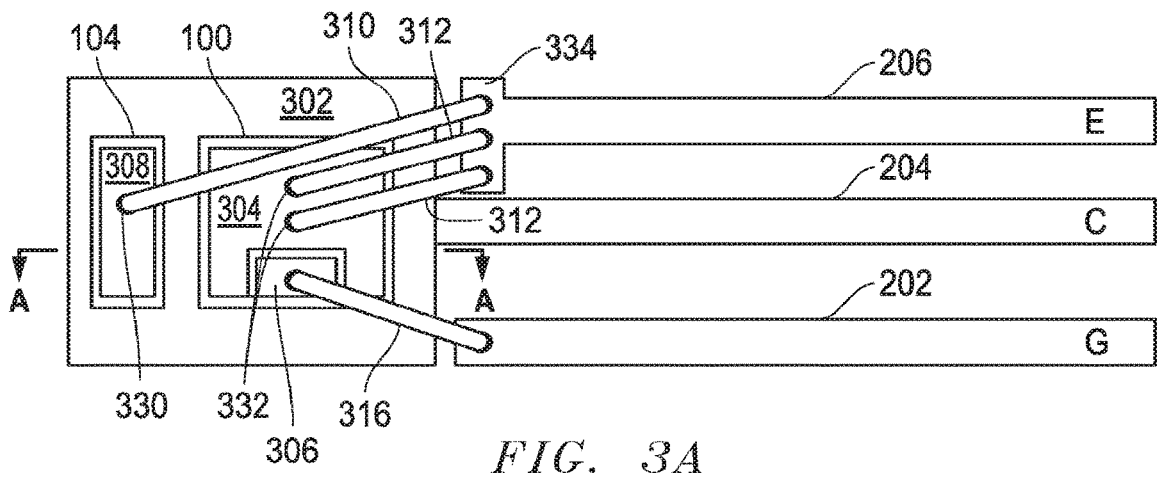
FIG. 3A is a top view of the package shown in FIG. 2 without the package housing.
Figure 3B:
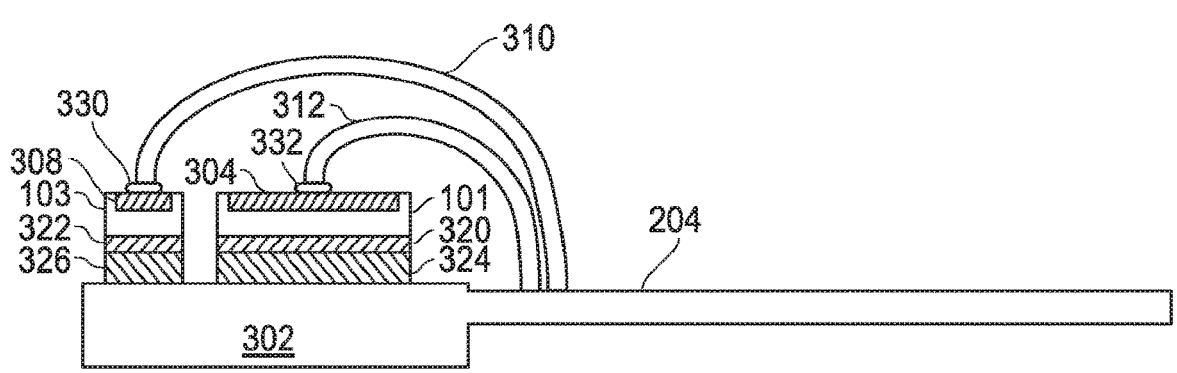
FIG. 3B is a cross-sectional view of the package shown in FIG. 3A taken along line AA.

With continuing reference to FIGS. 1A, 1B and 2, FIG. 3A shows a top view of package 200 without housing 210. FIG. 3B shows a cross sectional view of the package shown in FIG. 3A taken along line AA. Semiconductor dies 101 and 103 contain IGBT 100 and diode 104, respectively, and are separately solder attached to a conductive tab 302, which in turn is integrally connected to collector lead 204. Semiconductor dies 101 and 102 are also wire bond attached to gate lead 202 and emitter lead 206 as shown.

Electrically conductive material layers, called contact pads (hereinafter pads), may be formed on semiconductor substrates for establishing external electrical connections. For example, gate, emitter, and collector pads can be formed on a semiconductor substrates containing IGBTs. In one embodiment, the pads can be formed by depositing a conductive material on etched surfaces of the substrate using well known semiconductor manufacturing techniques. Semiconductor dies 101 and 103 contain pads. With continuing reference to FIGS. 3A and 3B, die 101 includes a conductive emitter pad 304 that is directly or indirectly connected to the emitter of IGBT 100, and a conductive gate pad 306 that is directly or indirectly connected to a gate of IGBT 100. A conductive collector pad 320 on the back of semiconductor die 101 is directly or indirectly connected to the collector of IGBT 100. Although not shown in the Figures, it should be noted that one or more layers of conductive material (e.g., nickel) between the collector and collector pad 320 may be present to connect the collector and collector pad. Similar intervening conductive layers may connect the gate to gate pad 306, and emitter to emitter pad 304. Diode 104 includes a conductive anode pad 308 that is directly or indirectly connected to the anode of diode 104. A conductive cathode pad 326 on the back of die 103 is directly or indirectly connected to the cathode of diode 104. The pads of IGBT 100 and diode 104 are formed from a conductive material (e.g., aluminum).

Collector lead 204 includes an integrated tab 302. The cathode pad 322 of diode 104 and the collector pad 320 of IGBT 100 are solder attached to tab 302 using a process that creates solder bonds 324 and 326, which are formed from a conductive solder material. SnAgCu is often chosen as the solder material during a solder attach process because SnAgCu has a low melting point (i.e., 230 degrees Celsius). The process used to solder attach a semiconductor die to a substrate like tab 302, is well known in the art.

Because solder bonds 324 and 326 are in contact with dies 101 and 103, respectively, the bonds' thermal and electrical resistance are critical in high power applications such as inverters. Unfortunately, solder bonds, such as bonds 324 and 326, however, may have relatively poor thermal and electrical conductivity. Electrical resistance between the die and the package results in heating, which is an energy-loss mechanism. Thermal resistance and electrical resistance of bonds 324 and 326 will increase with rising temperature. During the solder attach process, or during operation of IGBT 100 when it is transmitting large current and generating substantial heat, bubbles may be formed in SnAgCu bond 324 if the temperature exceeds 230 degrees Celsius. The bubbles could adversely affect the thermal and electrical characteristics of solder bond 324. The bubbles may also weaken the structural integrity of bonds 324 and 326. Fatigue is another concern with solder bonds 324 and 326. IGBT 100 and bond 324 expand and contract as they are heated and cooled while IGBT 100 switches on and off. The rate at which they expand and contract may be different, and the differences may eventually cause cracks in bond 324 and/or IGBT 100. To avoid these problems the current flow is limited to a value less than the maximum current IGBT 100 can transmit.

Emitter lead 206 includes integrated landing zone 334. The anode pad 308 is connected to landing zone 334 via bond wire 310. The emitter pad 304 is connected to landing zone 334 via wire bonds 312. Wire bonding is a method of making connections between a semiconductor die and package leads. Wire bonds usually consist of gold, copper, silver, aluminum or other conductive metals. Copper wire has become one of the preferred materials for wire bonding in many semiconductor packages. Copper wire does pose some challenges in that it is harder than both gold and aluminum and more susceptible to oxidation.

There are many techniques of wire bonding, but ball bonding is one of the most common. Most ball bonding processes use a combination of heat, pressure and ultrasound to make a weld at each end of the wire when connecting a die to a package lead. Ball bonders employ a needle-like disposable tool called the capillary, through which the wire is fed. A high-voltage electric charge is applied to the wire. This melts the wire at the tip of the capillary. The tip of the wire forms into a ball because of the surface tension of the molten metal. The ball quickly solidifies, and the capillary is lowered to the pad of the die, which is typically heated to the appropriate temperature. The machine then pushes down on the capillary and applies ultrasonic energy with an attached transducer. The combined heat, pressure, and ultrasonic energy create a weld between the ball and the pad, which is usually formed of copper or aluminum. This is the so-called ball bond that gives the process its name. FIGS. 3A and 3B show ball bonds 330 and 332. Next the wire is passed out through the capillary and the machine moves over to landing zone 334. The machine again descends, this time without making a ball so that the wire is crushed between the landing zone and the tip of the capillary. A weld is made in the same way by applying heat, pressure and ultrasonic energy. The resulting weld is quite different in appearance from the ball bond, and is commonly referred to as the second bond.

There are problems with wire bonding. Wire bonding is expensive and slow. The wires of wire bonds are limited in diameter, and as a result they are limited in the amount of current they can carry. More wire bonds could be added to increase the amount of current transmitted between emitter pad 304 and lead 206, but landing zone 334 and pad 304 are limited in size, and crowding pad 304 and/or zone 334 with additional wire bonds 312 can create problems for the ball bonder. There are additional problems with wire bonding.

Thermal fatigue is one. The resistance of physical interface between ball bonds 332 and pad 304, for example, can create local hot spots when IGBT 100 is transmitting current, which also causes local thermal expansion at the points in the die where the ball bonds are formed. Silicon can withstand 200° Celsius without failing, but localized thermal expansion caused by non-uniform heating where the wires are bonded to the pads, could cause the silicon to crack. Wires 312 could be replaced with a clip soldered to pad 304. But soldering a clip to emitter pad 304 could presents problems like those described above with reference to solder bond 324. Ultimately packages, such as the one shown in FIGS. 2, 3A and 3B, limit current transmission through the IGBT 100 in order to avoid device failures resulting from, for example, thermal expansion cracks in the silicon, even though the IGBT by itself can safely transmit substantially more than, for example, 90 A without problem.

Figure 4:
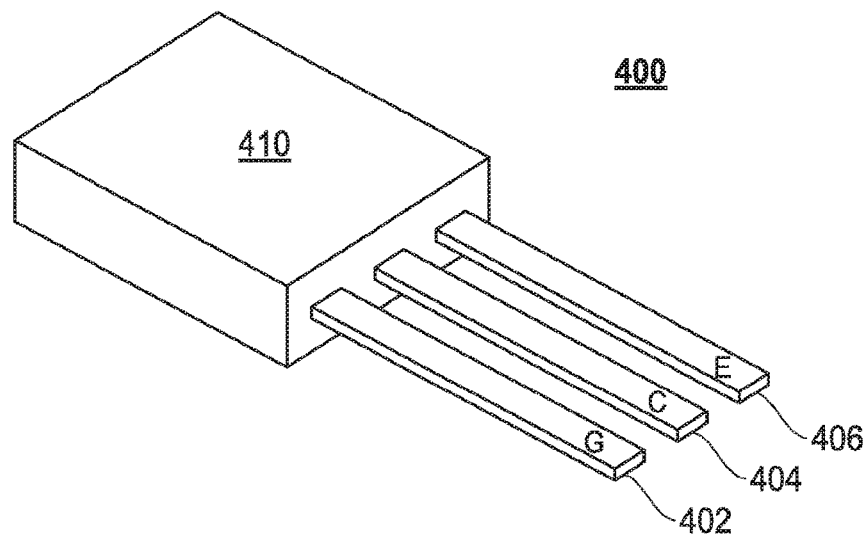
FIG. 4 illustrates a power device package employing one example embodiment.

The present embodiments eliminate problems with prior art discrete power device packages, including one or more of the problems that were described above with respect to FIGS. 2, 3A and 3B. FIG. 4 illustrates an example package 400 employing one example embodiment. For purposes of explanation, package 400 will be presumed to contain the same power device (i.e., IGBT 100 coupled to diode 104), except where noted.

Package 400 includes an encapsulation or housing 410 that can be formed from a non-conductive material such as an epoxy resin. Gate lead 402, collector lead 404, and emitter lead 406 extend from housing 410 and provide external connection to the collector, emitter, and gate, respectively, of IGBT 100. Package 400 and package 200 have substantially the same form factor; leads 402-406 have substantially the same spacing, sectional shape, size, etc., as leads 202-206 so that package 200 can be easily swapped with package 400 in the inverter of FIG. 1B. Notwithstanding some similarities between packages 200 and 400, substantial differences exist. Package 400 is more robust than package 200; package 400 can transmit substantially more current when compared to the amount of current that package 200 can transmit, and the number of times package 400 can switch the current without failure, exceeds the number of times package 200 can switch a similarly large current before it fails.

Figure 5A:
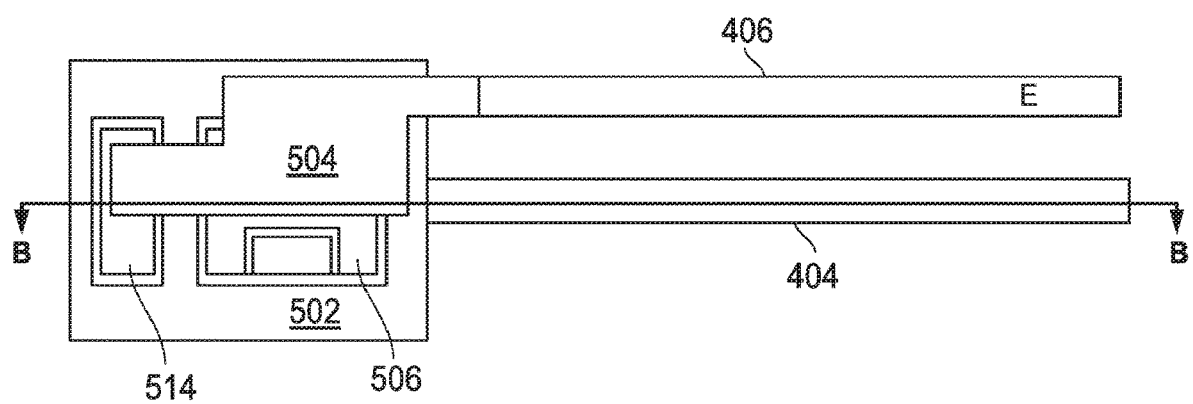
FIG. 5A is a top view of the package shown in FIG. 4 without the package housing and gate lead.
Figure 5B:
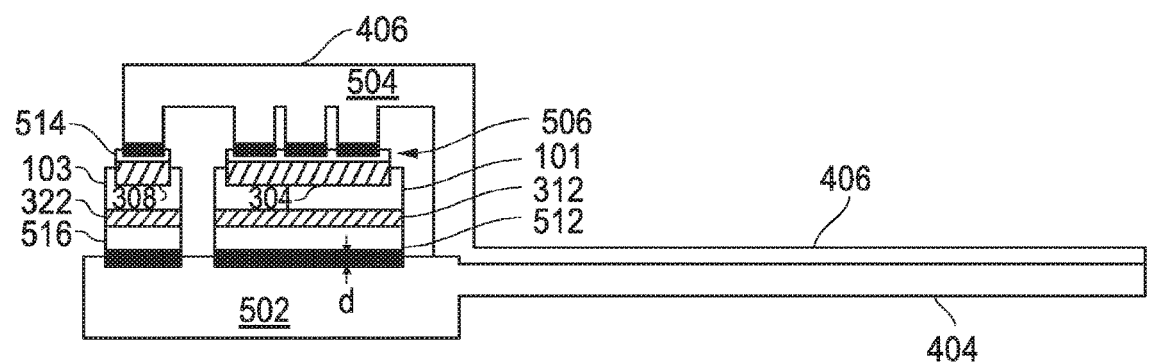
FIG. 5B is a cross-sectional view of the package shown in FIG. 5A taken along line BB.

With continuing reference to FIGS. 1A, 1B and 4, FIG. 5A shows a top view of package 400, but without housing 410 and gate lead 402. FIG. 5B shows a cross sectional view of the package shown in FIG. 5A taken along line BB. Semiconductor dies 101 and 103 contain IGBT 100 and diode 104, respectively. Semiconductor dies 101 and 103 are sinter attached to a conductive tab 502 of collector lead 404. In another embodiment, the semiconductor dies can be solder attached to tab 502. For the purposes of explanation only, the remaining description will presume that semiconductor dies 101 and 103 are sinter attached to tab 502 as will be more fully described below. Tab 502 is integrally connected to collector lead 404 in that the two are formed as a monolithic structure using unitary construction. In an alternative embodiment, tab 502 and collector lead 404 are manufactured separately and subsequently integrated together using, for example, a welding process or a sintering process. For the purposes of explanation only, the remaining description will presume that tab 502 and collector lead 404 are manufactured as a monolithic structure. Tab 502 and lead 404 can be plated with a sintering material such as silver.

Figure 6:
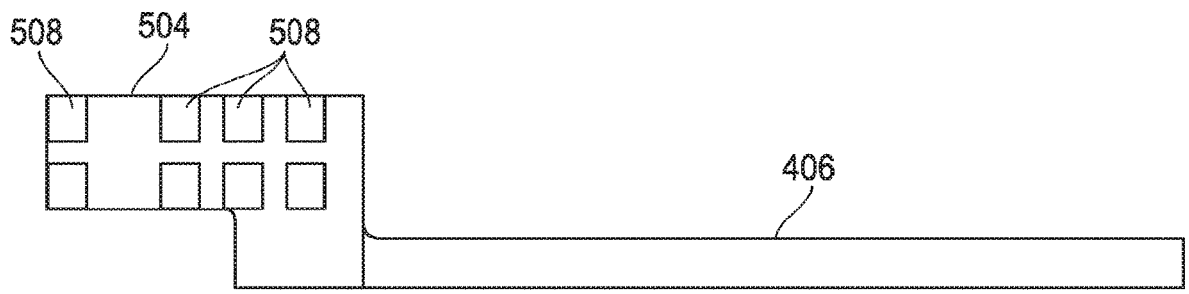
FIG. 6 is a bottom view of the clip shown in FIGS. 5A and 5B.

Semiconductor dies 101 and 103 are also sinter attached to solid top terminal 504 of emitter lead 406. Solid top terminal 504 will also be referred to as clip 504 in the remaining description. Clip 504 is integrally connected to emitter lead 406 in that the two are formed as a monolithic structure using unitary construction. In an alternative embodiment, clip 502 and emitter lead 406 are manufactured separately and subsequently integrated together using, for example, a welding process or a sintering process. For the purposes of explanation only, it will be presumed that clip 504 and emitter lead 406 are manufactured as a monolithic structure. FIG. 6 shows a plan view of clip 504 and lead 406. Clip 504 includes posts 508 that extend from the body. Each of the posts 508 has an end surface 509 that is substantially flat and configured to engage substantially flat surface areas of dies 101 and 103 as will be more fully described below. Clip 504 and lead 406 can be plated with a sintering material such as silver.

With continuing reference to FIGS. 1A, 4, 5A, 5b, and 6, the die 101 includes a layer 506 of conductive, sintering material (e.g., silver), which is formed on emitter pad 304. Layer 506 is sinter attached to clip 504. In another embodiment, pad 304 may be formed from a conductive sintering material, and subsequently sinter attached to clip 504 so that there is no intervening layer 506. For the purposes of explanation only, the remaining description will presume that die 101 includes sintering layer 506. While layer 506 covers the entire emitter pad 304 in FIGS. 5A and 5B, in an alternative embodiment, only the portion of emitter pad 304 that engages clip 504 is covered with sintering layer 506. Die 101 also includes a layer 512 of conductive, sintering material (e.g., silver), which is formed on collector pad 320. Layer 512 is sinter attached to tab 502. In another embodiment, pad 320 may be formed from a conductive sintering material during semiconductor fabrication, and subsequently sinter attached to tab 502 so that there is no intervening layer 512. However, the present embodiments will be described with reference to die 101 having sintering layer 512.

Die 103, which contains diode 104, includes a layer 514 of conductive material (e.g., silver), which is formed on anode pad 308. Layer 514 is sinter attached to clip 504. In another embodiment, pad 308 may be formed from a conductive sintering material, and subsequently sinter attached to clip 504 so that there is no intervening layer 514. However, the present embodiments will be described with reference to die 103 having layer 514. While layer 514 covers the entire anode pad 308 in FIGS. 5A and 5B, in an alternative embodiment, only the portion of anode pad 308 that is sinter attached to clip 504 is covered with layer 514. Die 103 also includes a layer 516 of conductive material (e.g., silver), which formed on the cathode pad 326. Layer 516 is sinter attached to tab 502. In another embodiment, the cathode pad may be formed from a conductive sintering material, and subsequently sinter attached to tab 502 so that there is no intervening layer 516. However, the present embodiments will be described with reference to die 103 having layer 516.

In the embodiment shown, clip 504 is formed from a conductive metal like copper, and subsequently plated with a sintering material (e.g., silver) before it is sinter attached to layers 506 and 514. Other sintering materials are contemplated. In one embodiment, only the ends of posts 508 that engage layers 506 and 514 need be plated with the sintering material. In an alternative embodiment, clip 504 and/or emitter lead 406 are fully formed of the sintering material. For purposes of explanation only, the entire monolithic structure of lead 406 and clip 504, including the ends of posts 508, is platted with silver before clip 504 is sinter attached to dies 101 and 103 via layers 506 and 514. Tab 504 is formed from a conductive metal like copper, and subsequently plated with a sintering material (e.g., silver) before it is sinter attached to layers 512 and 516. In one embodiment, only the surface tab 504 that engage dies 101 and 103 need be plated with the sintering material. In an alternative embodiment, tab 504 and/or lead 404 are fully formed of the sintering material. For purposes of explanation only, the entire monolithic structure of lead 404 and tab 502 is platted with silver before tab 502 is sinter attached to dies 101 and 103. The monolithic structure of clip 504 and lead 406 can be plated with silver using an electric plating process. The monolithic structure of tab 502 and 404 can also be plated with silver using an electric plating process. Other processes for plating or covering tab 502 and clip 504 with a silver layer are contemplated.

Sintering is a process of compacting and forming a solid mass of material by the application of heat and/or pressure without melting the material to the point of liquefaction. Sintering happens naturally in mineral deposits or as a manufacturing process used with metals, ceramics, and other materials. The atoms in the materials diffuse across the boundaries of the particles in two items (e.g., silver layer 506 and the silver plating of clip 504) to be sintered, fusing the items together and creating one solid piece. For purposes of explanation, the region where the atoms diffuse across the boundaries will be referred to herein as a sinter interface or sinter junction. Because the sintering temperature does not have to reach the melting point of the material to be sintered together, sintering is often chosen as the process for integrating materials with extremely high melting points such as silver, tungsten and molybdenum.

Tab 502, clip 504, die 101 and die 103 can be subjected to a sintering process to create a monolithic structure. In one embodiment, the sintering process includes applying pressure (e.g., 12 MPascal) and heat (e.g., 230 C) to items to be sinter attached to each other. Silver does not melt at 230 C. There could be one sinter process in which silver layers 506, 512, 514, and 516 of dies 101 and 103 are simultaneously sinter attached to the silver layers formed by plating on tab 502 and clip 504. Or only one of silver layers 506, 512, 514, and 516 is sinter attached to die 101 or 103. Still further, the silver layers 516 and/or 512 can be sinter attached with tab 502 during a first sinter process, and then silver layers 506 and/or 514 can be sinter integrated with clip 504 during a second and subsequent sinter process. The sintering process creates sinter junctions 520 between clip 504 and the dies, and sinter junctions 522 between and tab 502. It should be noted that FIG. 5B is not drawn to scale. Sinter junctions 520 are drawn to emphasize that a portion of junctions 520 extend into the silver plating of clip 504, while the remaining portion of junctions 520 extend into silver layers 506 and 514. Likewise, sinter junctions 522 are drawn to emphasize that a portion of junctions 522 extend into the silver plating of tab 502, while the remaining portion of junctions 522 extend into silver layers 512 and 516. In reality, the sinter junctions may have a depth "d" between 10 and 30 nm. Sintered junctions 520 extend into the plated silver of posts 508 and silver layers 506 and 514, thereby creating a fused or integral connection between clip 504 and the dies containing IGBT 100 and diode 104, and sintered junctions 522 extend into the plated silver of tab 502 and silver layers 512 and 516, thereby creating an integral connection between tab 502 and the dies containing IGBT 100 and diode 104. Not only do the junctions integrate the dies with tab 502 and clip 504, the junctions transmit substantial current. It is noted that silver, and thus the silver sinter junctions 522, have a higher melting temperature when compared to SnAgCu, thus obviating some of the problems described above with respect to package 200. Moreover the cross section area of junctions 520 can be larger than the cross section areas where the ball bonds shown in FIGS. 3A and 3B weld to dies 101 and 103, thereby increasing the area in which dies 101 and 103 are heated during current switching.

Figure 7:
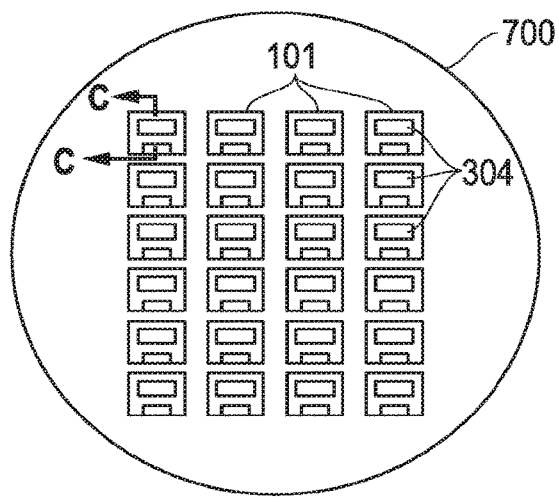
FIG. 7 illustrates an example wafer on which IGBT dies are partially formed.
Figure 8:
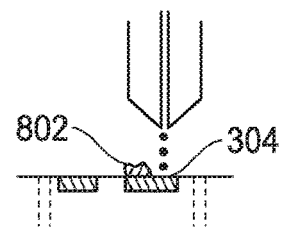
FIG. 8 illustrates an example process for forming a layer of conductive sintering material on an emitter pad of an example die of the wafer shown in FIG. 7.
Figure 9:
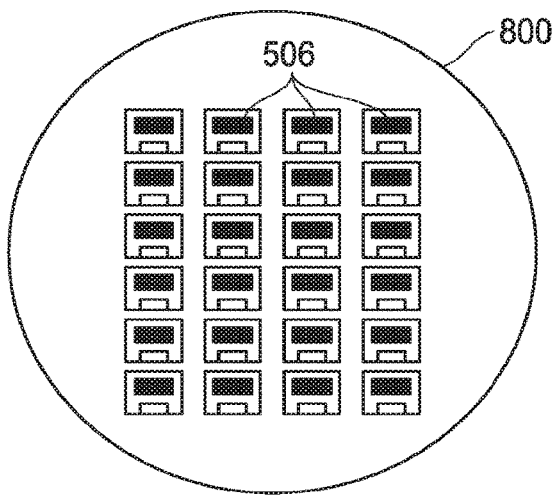
FIG. 9 illustrates the wafer shown in FIG. 7 after formation of layers of conductive sintering material on emitter pads of IGBTs.

Silver layer 506, in one embodiment, is formed on pad 304 while die 101 is being manufactured. FIG. 7 illustrates an example wafer 700 containing dies 101, each of which contains an IGBT like the IGBT 101. While dies 101 are part of wafer 700, silver layer 506 can be formed on emitter pad 304. FIG. 8 illustrates a cross-sectional view of one of the dies 101 taken along line CC in FIG. 7 as silver layer 506 is formed. As shown in FIG. 7, a paste or other form of silver is deposited on pad 304 as layer 506. Thereafter, layer 506 can integrated with pad 304 using, for example, a sintering process. U.S. Pat. No. 8,586,480, which is incorporated herein by reference, describes a process that could be to sinter integrate pad 304 and layer 506. FIG. 9 shows wafer 700 with silver layers 506 integrated with emitter pads 304. Gates and collector pads of the dies 101 may also be sintered with silver layers in similar fashion. Eventually, dies 101 are cut from wafer 700.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. An apparatus comprising:
a first die comprising a transistor, the transistor comprising a first electrode and a second electrode; and
a first conductor electrically coupled to the first electrode and sintered directly to an electroplated second conductor including a first lead; and
a third conductor electrically coupled to the second electrode and sintered directly to an electroplated fourth conductor including a second lead,
wherein the first conductor and the second conductor comprise conductive layers, and
wherein the transistor comprises an insulated-gate bipolar transistor (IGBT), and wherein the first electrode comprises a collector of the IGBT.

2. The apparatus of claim 1 wherein the second conductor is electroplated with a conductive material, and wherein the first conductor also comprises the conductive material.

3. The apparatus of claim 2 wherein the conductive material comprises silver.

4. The apparatus of claim 1 further comprising:
a package;
wherein the package fully contains the first die and the first conductor;
wherein the package partially contains the electroplated second conductor such that a portion of the electroplated second conductor extends from the package.

5. The apparatus of claim 4, wherein the electroplated second conductor is a monolithic structure such that the portion extending from the package is monolithically formed with an opposite portion that is sintered to the first conductor.

6. The apparatus of claim 1 wherein the first conductor was formed on the die before the die was cut from a wafer that comprises a plurality of dies, and wherein the first conductor and the electroplated second conductor were sintered together after the die was cut from the wafer.

7. The apparatus of claim 1 wherein the first conductor comprises a first pad that was formed on the die before the die was cut from a wafer comprising a plurality of dies, wherein the electroplated second conductor comprises a first element and an integrally connected second element that extends at a non-zero angle from the first element, wherein the second element exposes a substantially flat surface area before the first conductor and the electroplated second conductor were sintered together, and wherein the exposed surface area is sintered to the first pad.

8. The apparatus of claim 1 further comprising: a second die, the second die comprising a device, the device comprising a first device terminal; a third conductor sintered to the electroplated second conductor; wherein the third conductor is electrically coupled to the first device terminal.

9. The apparatus of claim 1 wherein the first conductor and the electroplated second conductor were sintered together by heating the first conductor and the first electroplated second conductor without liquefying the first conductor or a portion thereof.

10. The apparatus of claim 1, wherein the first conductor is wirelessly electrically coupled to the first electrode and the second conductor, and the third conductor is wirelessly electrically coupled to the second electrode and the fourth conductor.

11. A method comprising:
   forming a transistor on a die of a wafer, wherein the transistor comprises a first electrode and a second electrode;
   forming a first conductor on the die, wherein the first conductor is a conductive layer electrically coupled to the first electrode;
   cutting the die from the wafer after the first conductor is formed thereon;
   plating a second conductor including a first lead with a conductive material;
   sintering the plated second conductor directly with the first conductor after the first die is cut from the wafer;
   forming a fourth conductor on the die, wherein the fourth conductor is a conductive layer electrically coupled to the second electrode;
   plating a fifth conductor including a second lead with the conductive material; and
   sintering the plated fourth conductor directly with the fourth conductor after the first die is cut from the wafer,
   wherein the transistor comprises an insulated-gate bipolar transistor (IGBT), and
   wherein the first electrode comprises a collector of the IGBT.

12. The method of claim 11 wherein the first conductor comprises the conductive material.

13. The method of claim 12 wherein the conductive material is silver.

14. The method of claim 11 further comprising: forming a diode on a second die, wherein the diode comprises a first diode electrode; forming a third conductor on the second die, wherein the third conductor is electrically coupled to the first diode electrode; cutting the second die from another wafer that includes a plurality of dies, wherein the second die is cut from the other wafer after the third conductor is formed on the second die; and sintering the plated second conductor with the third conductor after the second die is cut from the other wafer.

15. The method of claim 11 wherein the sintering comprises heating the first conductor and the plated second conductor at the same time without liquefying the first conductor or the plated second conductor, or any portion of either.

16. The method of claim 11 wherein the sintering comprises compressing the first conductor and the plated second conductor together without liquefying the first conductor or the plated second conductor, or any portion of either.

17. The method of claim 11 further comprising encapsulating the die, the first conductor, and a portion of the plated second conductor with an encapsulating material in order to create a package, wherein the plated second conductor extends from the package after the encapsulation.

18. The method of claim 11 wherein the act of plating the second conductor comprises electroplating the second conductor with the conductive material.

19. An apparatus comprising:
   a substrate comprising a first conductive material;
   a die mounted on the substrate, the die comprising a transistor, the transistor comprising a first electrode and a second electrode; and
   a first conductor electrically coupled to the first electrode and fused directly to a plated second conductor including a first lead;
   a third conductor electrically coupled to the second electrode and fused directly to a plated fourth conductor including a second lead;
   wherein the first conductor and the second conductor comprise conductive layers, and
   wherein the transistor comprises an insulated-gate bipolar transistor (IGBT), and wherein the first electrode comprises a collector of the IGBT.

20. The apparatus of 19 wherein the first conductor was fused to the plated second conductor by heating the first conductor and the plated second conductor without liquefying either the first conductor or the plated second conductor, or a portion thereof.

* * * * *